(12) United States Patent
Park

(10) Patent No.: US 8,212,301 B2
(45) Date of Patent: Jul. 3, 2012

(54) CAPACITOR AND METHOD FOR FABRICATING THE SAME

(75) Inventor: Jong-Bum Park, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 13/008,831

(22) Filed: Jan. 18, 2011

(65) Prior Publication Data

US 2011/0116209 A1    May 19, 2011

Related U.S. Application Data

(62) Division of application No. 11/967,200, filed on Dec. 30, 2007, now Pat. No. 7,871,889.

(30) Foreign Application Priority Data

Mar. 16, 2007    (KR) .................. 10-2007-0026087

(51) Int. Cl.
*H01L 29/72* (2006.01)
(52) U.S. Cl. ........................ 257/310; 257/532
(58) Field of Classification Search .......... 257/310, 257/532
See application file for complete search history.

(56) References Cited

U.S. PATENT DOCUMENTS

| | | | | |
|---|---|---|---|---|
| 6,730,573 B1 * | 5/2004 | Ng et al. | ...................... | 438/381 |
| 7,723,770 B2 * | 5/2010 | Choi et al. | .................... | 257/310 |
| 2003/0062558 A1 * | 4/2003 | Yang et al. | ................... | 257/296 |
| 2006/0234466 A1 * | 10/2006 | Jeong et al. | ................... | 438/396 |

FOREIGN PATENT DOCUMENTS

| | | |
|---|---|---|
| KR | 1020060052474 A | 5/2006 |
| KR | 1020060102470 A | 9/2006 |
| KR | 100648860 B1 | 11/2006 |
| KR | 1020070027789 A | 3/2007 |

OTHER PUBLICATIONS

Korean Intellectual Property Office, Notice of Preliminary Rejection, Application No. 10-2007-0026087, Feb. 21, 2008.

* cited by examiner

*Primary Examiner* — Edward Wojciechowicz
(74) *Attorney, Agent, or Firm* — Kilpatrick Townsend & Stockton LLP

(57) ABSTRACT

A capacitor includes a lower electrode, a first dielectric layer formed over the lower electrode, a second dielectric layer formed over the first dielectric layer, wherein the second dielectric layer includes an amorphous high-k dielectric material, a third dielectric layer formed over the second dielectric layer, and an upper electrode formed over the third dielectric layer. The third dielectric layer can be thicker than the first dielectric layer.

9 Claims, 5 Drawing Sheets

CAPACITOR AND METHOD FOR FABRICATING THE SAME

CROSS-REFERENCE TO RELATED APPLICATIONS

The present invention is a divisional of U.S. patent application Ser. No. 11/967,200, filed on Dec. 30, 2007, which claims priority of Korean patent application number 10-2007-0026087, filed on Mar. 16, 2007, both of which are incorporated by reference in their entirety.

BACKGROUND OF THE INVENTION

The present invention relates to a method for fabricating a semiconductor device, and more particularly, to a method for fabricating a capacitor with a multilayer dielectric layer.

As a semiconductor memory device becomes highly integrated, an area for a capacitor is reduced, making it difficult to obtain a high capacitance from the capacitor. Therefore, there has been proposed a number of methods to ensure the high capacitance of the capacitor within a limited area. One method is to form a dielectric layer of a high-k dielectric material.

Instead of oxide nitride oxide (ONO) or aluminium oxide ($Al_2O_3$), zirconium ($ZrO_2$) having a higher dielectric constant has been widely used in recent years.

However, when this high-k dielectric material alone is used for the dielectric layer, leakage current characteristics of a capacitor may be degraded.

To overcome this limitation, researching efforts have been made to fabricate a capacitor including a multilayer dielectric layer with an aluminum oxide layer interposed within high-k dielectric material.

The typical method for fabricating the capacitor will be described in more detail with reference to FIGS. 1A to 1E.

FIGS. 1A to 1E illustrate a typical method for fabricating a capacitor. More specifically, a cylinder-type capacitor having excellent capacitance characteristic is illustrated.

Referring to FIG. 1A, an interlayer dielectric layer 11 with a conductive plug 12 is formed over a substrate (not shown) with a given lower structure.

A nitride layer 13 and a mold oxide layer 14 are sequentially formed over the interlayer dielectric layer 11. The nitride layer 13 serves as an etch stop layer, and the mold oxide layer 14 defines a region where a lower electrode will be formed. The mold oxide layer 14 may include a stacked structure of a phosphorus silicate glass (PSG) or boron phosphorus silicate glass (BPSG) layer 14A and a plasma enhanced tetraethyl orthosilicate (PETEOS) layer 14B.

Referring to FIG. 1B, the mold oxide layer 14 and the nitride layer 13 are etched to expose a given portion of the conductive plug 12, thereby forming a lower electrode region 15.

Referring to FIG. 1C, a TiN layer 16 for a lower electrode is formed over the lower electrode region 15 and the mold oxide layer 14.

Referring to FIG. 1D, a chemical mechanical polishing (CMP) process is performed until the top surface of the mold oxide layer 14 is exposed. The mold oxide layer 14 is removed by a wet etching process, thereby forming a cylinder type lower electrode 16A with separation from neighboring electrodes.

Referring to FIG. 1E, a first dielectric layer 17 is formed over the lower electrode 16A and the nitride layer 13. The first dielectric layer 17 may be formed of a high-k dielectric material, e.g., zirconium oxide.

Although not shown, a second dielectric layer is formed of aluminum oxide over the first dielectric layer 17, and a third dielectric layer is formed of zirconium oxide over the second dielectric layer. An upper electrode is formed over the third dielectric layer. In this way, the capacitor is fabricated.

As described above, the aluminum oxide layer for enhancing the leakage current characteristic is formed within the high-k material for ensuring the static capacitance, thereby improving the capacitance and leakage current characteristics simultaneously.

Particularly, the high-k dielectric material is formed at a low temperature, thereby improving step coverage characteristics. Crystallization of the formed high-k dielectric material is increased by depositing the aluminum oxide layer at a high temperature, thereby increasing the static capacitance of the capacitor. However, the method for fabricating the capacitor using the typical process of forming the dielectric layer has the following limitations.

First, referring to FIG. 2, when a cylinder-type capacitor is fabricated using the typical process of forming the dielectric layer, the cylinder-type lower electrodes can be touching while the zirconium oxide layer of the first dielectric layer is excessively crystallized during the process of depositing the aluminum oxide layer at a high temperature. This causes a dual bit fail in a reliability test.

Second, when an another capacitor, such as a concave-type capacitor is fabricated by using the typical process of forming the dielectric layer, a dual bit fail does not occur, but the total static capacitance of the capacitor is reduced. This is because the aluminum oxide layer used for ensuring the leakage current characteristic of the capacitor has a dielectric constant smaller than that of the zirconium oxide layer.

Therefore, there is a need for technologies that can ensure the leakage current characteristic of the capacitor, increase the static capacitance of the capacitor, and prevent the lower electrodes of the cylinder-type capacitor from touching.

SUMMARY OF THE INVENTION

Embodiments of the present invention are directed to providing a capacitor and a method for fabricating the same, which can provide an improved leakage current characteristic and an increased static capacitance by using a multilayer dielectric layer with an amorphous high-k dielectric material interposed within high-k dielectric materials, and can prevent lower electrodes of a cylinder-type capacitor from being attached to each other by depositing an amorphous high-k dielectric material at a low temperature.

In accordance with an aspect of the present invention, there is provided a capacitor. The capacitor includes a lower electrode, a first dielectric layer formed over the lower electrode, a second dielectric layer formed over the first dielectric layer, wherein the second dielectric layer includes an amorphous high-k dielectric material, a third dielectric layer formed over the second dielectric layer, and an upper electrode formed over the third dielectric layer.

In accordance with another aspect of the present invention, there is provided a method for fabricating a capacitor. The method includes forming a lower electrode, forming a first dielectric layer over the lower electrode, forming a second dielectric layer of an amorphous high-k dielectric material over the first dielectric layer, forming a third dielectric layer over the second dielectric layer, and forming an upper electrode over the third dielectric layer.

DESCRIPTION OF SPECIFIC EMBODIMENTS

Hereinafter, a capacitor and a method for fabricating the same in accordance with the present invention will be described in detail with reference to the accompanying drawings.

Figure 1A:
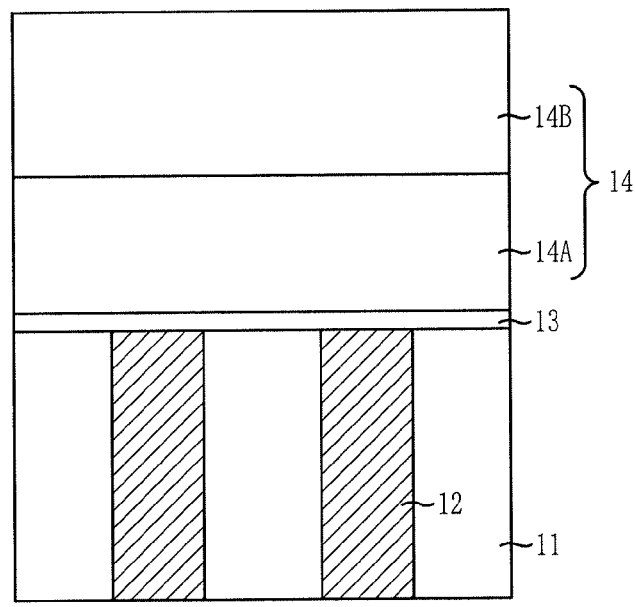
FIGS. 1A to 1E illustrate a typical method for fabricating a capacitor.
Figure 1B:
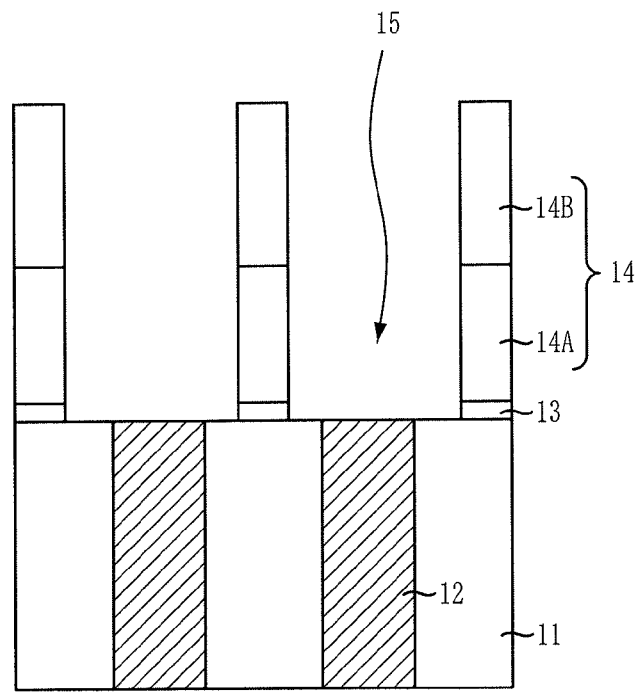
Figure 1C:
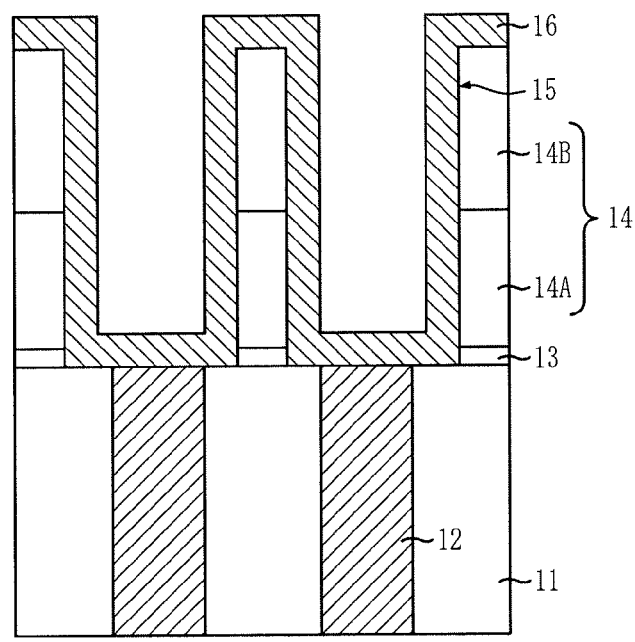
Figure 1D:
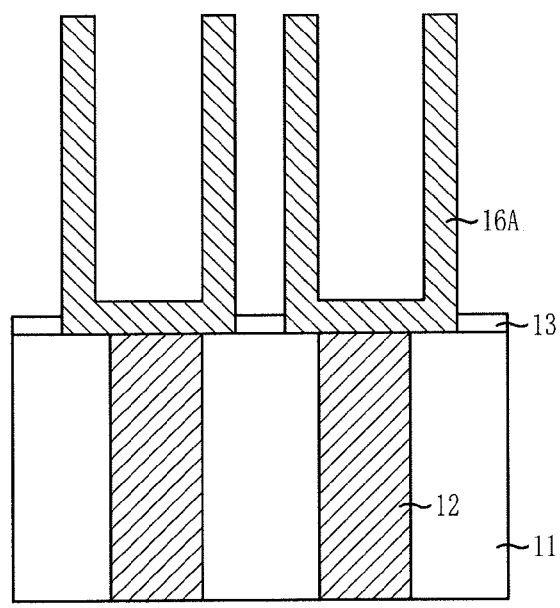
Figure 1E:
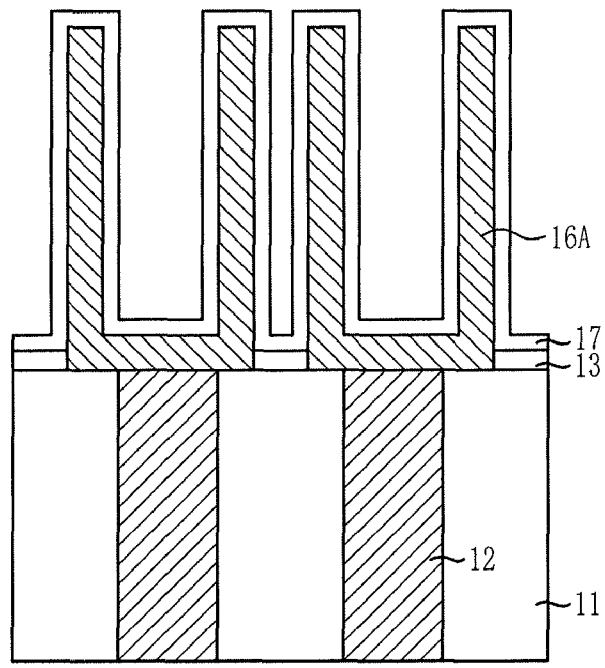
Figure 2:
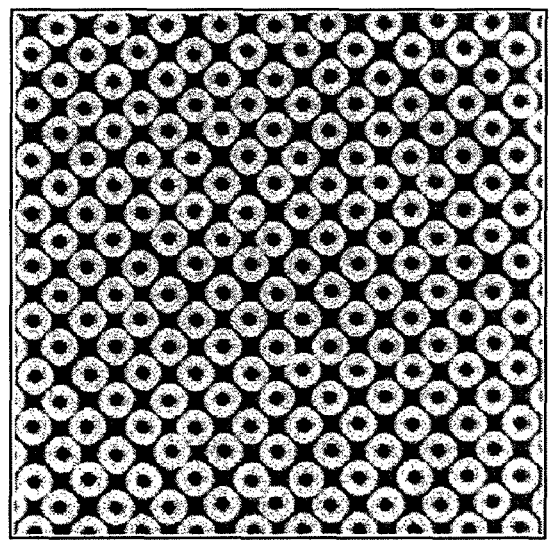
FIG. 2 illustrates a micrographic view of a top surface of the capacitor of FIG. 1E.
Figure 3:
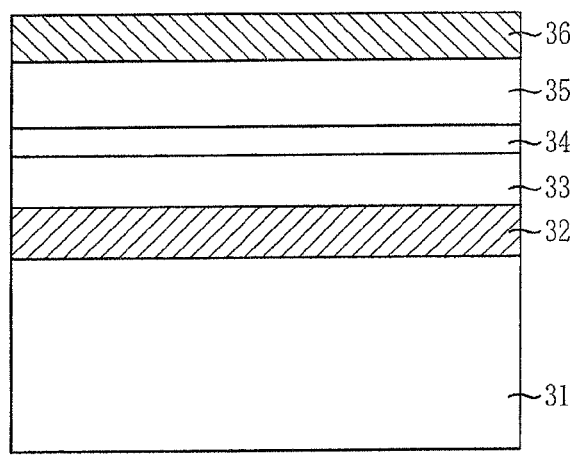
FIG. 3 illustrates a cross-sectional view of a capacitor in accordance with an embodiment of the present invention.

FIG. 3 illustrates a cross-sectional view of a capacitor in accordance with an embodiment of the present invention. The present invention can be applied to various types of capacitors, e.g., a cylinder-type capacitor, a concave-type capacitor, etc.

Referring to FIG. 3, the capacitor includes a substrate 31 in which a predetermined lower structure is formed. A lower electrode 32 is formed over the substrate 31. First to third dielectric layers 33, 34 and 35 are sequentially formed over the lower electrode 32. An upper electrode 36 is formed over the third dielectric layer 35.

The lower electrode 32 and the upper electrode 36 may be formed of a metal, e.g., titanium nitride (TiN), ruthenium (Ru), platinum (Pt), iridium (Ir), hafnium nitride (HfN), etc.

The first and third dielectric layers 33 and 35 are formed of a crystalline high-k dielectric material such as zirconium oxide. In this case, the third dielectric layer 35 is thicker than the first dielectric layer 33.

The second dielectric layer 34 is formed of an amorphous high-k dielectric material such as tantalum oxide ($Ta_2O_5$). In this case, the second dielectric layer 34 is thinner than the first and third dielectric layers 33 and 35. For example, the second dielectric layer 34 may have a thickness less than approximately 10 Å. The total thickness of the first to third dielectric layer 33, 34 and 35 may be in a range from approximately 100 Å to approximately 150 Å.

The static capacitance of the capacitor can be ensured by forming the first and third dielectric layers 33 and 35 of the crystalline high-k dielectric material, and the leakage current characteristic can be ensured by forming the amorphous high-k dielectric material, without decreasing the static capacitance of the capacitor. Particularly, the static capacitance characteristic can be further improved by forming the third dielectric layer 35 thicker than the first dielectric layer 33. In addition, in the case that the lower electrode 32 is cylindrical, the touching of the lower electrodes can be prevented because the high-k dielectric material used for the second dielectric layer 34 is formed at a low temperature.

Figure 4A:
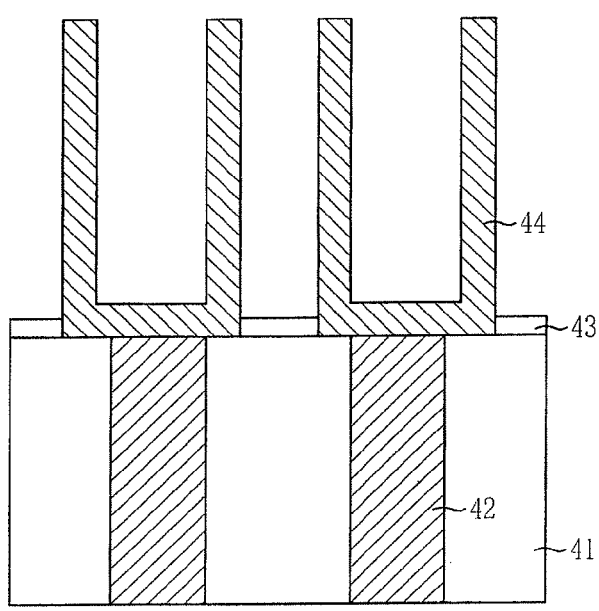
FIGS. 4A and 4B illustrate a method for fabricating a capacitor in accordance with an embodiment of the present invention.
Figure 4B:
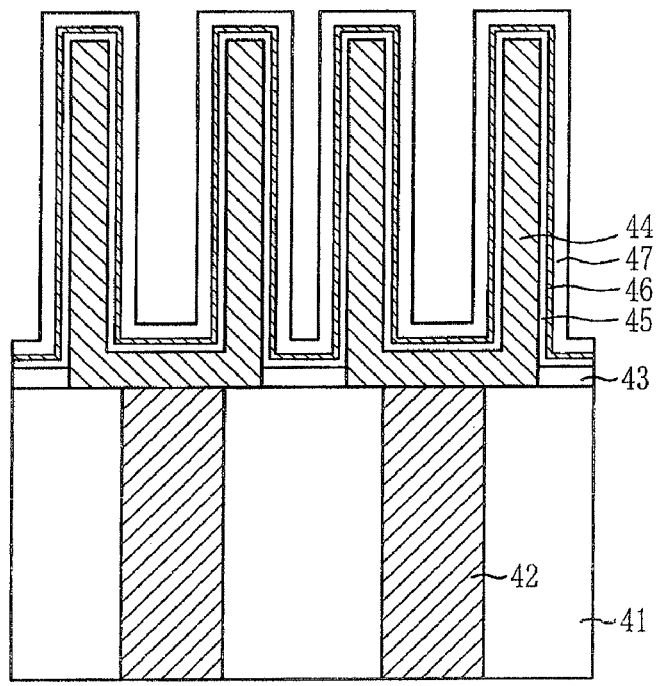

FIGS. 4A and 4B illustrate a method for fabricating a capacitor according to an embodiment of the present invention. Although a cylinder-type capacitor is illustrated, the present invention can also be applied to various types of capacitors, e.g., a concave-type capacitor.

Referring to FIG. 4A, a substrate structure with a cylinder-type lower electrode 44 is formed. More specifically, an interlayer dielectric layer 41 with a conductive plug 42 is formed over a substrate (not shown) in which a given lower structure is formed. A nitride layer 43 and a mold oxide layer (not shown) are sequentially formed over the interlayer dielectric layer 41. The nitride layer 43 serves as an etch stop layer and the mold oxide layer defines a region where a lower electrode will be formed. The mold oxide layer and the nitride layer 43 are etched to expose a given portion of the conductive plug 42, thereby defining a lower electrode region. Material for a lower electrode is formed over the lower electrode region and the mold oxide layer. A chemical mechanical polishing (CMP) process is performed until the top surface of the mold oxide layer is exposed. The mold oxide layer is removed by a wet etching process, thereby forming a cylinder type lower electrode 44. The lower electrode 44 may be formed of a metal, e.g., TiN, Ru, Pt, Ir, HfN, etc.

Referring to FIG. 4B, a cleaning process is performed by using hydrogen fluoride (HF) or buffered oxide etchant (BOE), thereby forming a first resultant structure. A first dielectric layer 45 is formed of high-k dielectric material over a surface profile of the first resultant structure in which the lower electrode 44 is formed. For example, the first dielectric layer 45 is formed by using an atomic layer deposition (ALD) process. The first dielectric layer 45 is formed of zirconium oxide as the high-k dielectric material.

The ALD process of forming the zirconium oxide layer is performed in a chamber maintaining a pressure ranging from approximately 0.1 Torr to approximately 10 Torr and a low temperature less than approximately 350☐, preferably ranging from approximately 250° C. to approximately 350° C. The ALD process of forming the zirconium oxide layer is performed within the low temperature chamber in order to further improve a step coverage characteristic of the zirconium oxide layer.

More specifically, a process of adsorbing a zirconium source is performed. A precursor gas is one selected from the group consisting of $Zr[NC_2H_5CH_3]_4$, $Zr[N(CH_3)_2]_4$, $Zr[OC(CH_3)_2CH_2OCH_3]_4$, $Zr[OC(CH_3)_3]_4$, $ZrCl_4$, and $ZrI_4$, and a combination thereof. The precursor gas flows for approximately 2 seconds to approximately 10 seconds. The precursor gas further includes argon (Ar) gas as a carrier gas and flows at a flow rate of approximately 100 sccm to approximately 2,000 sccm.

A purge process is performed to remove unreacted zirconium gas. Nitride ($N_2$) or Ar gas flows at a flow rate of approximately 100 sccm to approximately 3,000 sccm for approximately 2 seconds to approximately 10 seconds.

A process of supplying a reaction gas is performed. $O_3$ gas, $H_2O$ gas or $O_2$ gas flows as a reaction gas at a flow rate of approximately 100 sccm to approximately 3,000 sccm. As described above, layer quality is degraded because the zirconium oxide layer is formed at a low temperature in a chamber in order to improve the step coverage characteristic. Furthermore, since the tantalum oxide layer of the second dielectric layer is formed at a low temperature in order to prevent the cylinder type lower electrodes from touching neighboring cylinder type lower electrodes, the crystallization of the zirconium oxide layer is reduced. Thus, the static capacitance of the capacitor is reduced. Therefore, by adjusting a flow time of the reaction gas, the crystallization of the zirconium oxide layer can be improved and the layer quality thereof can be improved. For example, the reaction gas flows for approximately 5 seconds to approximately 10 seconds, which is longer than in the typical method.

A purge process is performed to remove the unreacted gas and reaction by-product. $N_2$ or Ar gas flows at a flow rate of approximately 100 sccm to approximately 3,000 sccm for approximately 2 seconds to approximately 10 seconds.

The zirconium oxide layer with a desired thickness can be formed by repeating the above-described four processes. For example, the zirconium oxide layer may have a thickness of approximately 51 Å.

A second dielectric layer 46 is formed of an amorphous high-k dielectric material over the first dielectric layer 45. The second dielectric layer 46 may be formed by using an ALD process. The second dielectric layer 46 includes tantalum oxide as the amorphous high-k dielectric material. The tantalum oxide layer has three times as high as the dielectric constant of the typical aluminum oxide layer and can ensure the same leakage current characteristic.

The process of forming the tantalum oxide layer using the ALD process is performed within the chamber maintaining a low temperature less than approximately 400° C., preferably ranging from approximately 100° C. to approximately 400° C., and a pressure ranging from approximately 0.1 Torr to approximately 10 Torr. Since the tantalum oxide layer is formed at a temperature higher than the temperature for forming the zirconium oxide layer, the zirconium oxide layer is crystallized to an extent that the attachment between the cylinder type lower electrodes does not occur.

More specifically, a process of adsorbing a tantalum source is performed by using $TaCl_5$ gas as a precursor gas. The $TaCl_5$ flows for approximately 1 second to approximately 10 seconds. The precursor gas includes Ar gas as a carrier gas and flows at a flow rate of approximately 100 sccm to approximately 3,000 sccm.

A purge process is performed to remove unreacted tantalum source. $N_2$ or Ar gas flows for approximately 1 second to approximately 10 seconds.

A process of supplying a reaction gas is performed. $O_3$ gas or $O_2$ gas flows as the reaction gas for approximately 1 second to approximately 10 seconds.

A purge process is performed to remove unreacted gas and reaction by-products. $N_2$ gas flows for approximately 1 second to approximately 10 seconds.

The tantalum oxide layer with a given thickness can be formed by repeating the above-described four processes. In order for prevent the leakage current, the tantalum oxide layer is formed to a thickness less than approximately 10 Å. For example, when the zirconium oxide layer of the first dielectric layer 45 has a thickness of approximately 51 Å, the tantalum oxide layer has a thickness of approximately 5 Å.

Figure 5:
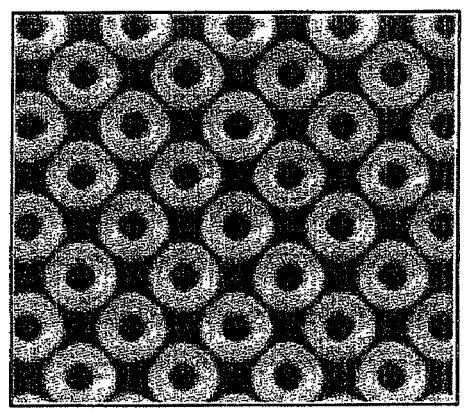
FIG. 5 illustrates a micrographic view of a top surface of the capacitor of FIG. 4B.

By forming the second dielectric layer 46 using the tantalum oxide, the leakage current characteristic can be improved and a total static capacitance of the capacitor can be increased compared with the typical aluminum oxide layer. Further, referring to FIG. 5, since the tantalum oxide layer is formed at a low temperature less than approximately 400° C., it is possible to prevent the cylinder type lower electrodes from being attached to neighboring cylinder type lower electrodes while the zirconium oxide layer of the first dielectric layer is excessively crystallized.

A third dielectric layer 47 includes high-k dielectric material over the second dielectric layer 46. The third dielectric layer 47 is formed by using an ALD process. The third dielectric layer 47 includes zirconium oxide, which is the same material as the first dielectric layer 45. The process of forming the zirconium oxide layer for the third dielectric layer 47 by using the ALD process is the same as the process of forming the first dielectric layer 45.

The third dielectric layer 47 is formed thicker than the first dielectric layer 45. For example, when the first dielectric layer 45 has a thickness of approximately 51 Å, the thick dielectric layer 47 has a thickness of approximately 65 Å. Although the first dielectric layer 45 is formed at a low temperature, layer quality of the first dielectric layer 45 can be improved due to the following process of forming the second dielectric layer 46. However, the third dielectric layer 47 has a poor layer quality because it is formed after the forming of the second dielectric layer 46. Thus, the leakage current characteristic at an interface between an upper electrode and the third dielectric layer 47 can be improved by forming the third dielectric layer 47 to have a thickness thicker than the first dielectric layer 45. Further, the layer quality and the crystallization of the third dielectric layer 47 are improved, thereby increasing the static capacitance of the capacitor.

The first to third dielectric layers 45, 46 and 47 have a total thickness ranging from approximately 100 Å to approximately 150 Å.

Although it is not shown, an upper electrode is formed over the third dielectric layer 47. The upper electrode may be formed of a metal, e.g., TiN, Ru, Pt, Ir, HfN, etc.

As described above, the capacitor is formed by using the multilayer dielectric layer with amorphous high-k dielectric material interposed within the high-k dielectric materials, thereby ensuring the static capacitance and improving the leakage current characteristic. Particularly, because the amorphous high-k dielectric material is formed at a low temperature, it is possible to prevent the lower electrodes of the cylinder-type capacitor from touching. In this case, the reduction in the static capacitance of the capacitor, which may be caused by the low-temperature deposition process, can be prevented by increasing the flow time of the reaction gas during the ALD process for forming the third dielectric layer thicker than the first dielectric layer.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A capacitor comprising:
   a lower electrode;
   a first dielectric layer formed over the lower electrode;
   a second dielectric layer formed over the first dielectric layer, wherein the second dielectric layer includes an amorphous high-k dielectric material;
   a third dielectric layer formed over the second dielectric layer, wherein the third dielectric layer is thicker than the first dielectric layer; and
   an upper electrode formed over the third dielectric layer.

2. The capacitor of claim 1, wherein the second dielectric layer comprises a tantalum oxide layer.

3. The capacitor of claim 1, wherein each of the first dielectric layer and the third dielectric layer comprises a zirconium oxide layer.

4. The capacitor of claim 1, wherein the second dielectric layer comprises a tantalum oxide layer, and each of the first dielectric layer and the third dielectric layer comprises a zirconium oxide layer.

5. The capacitor of claim 1, wherein the second dielectric layer has a thickness no more than approximately 10 Å.

6. The capacitor of claim 1, wherein the first dielectric layer is thicker than the second dielectric layer.

7. The capacitor of claim 6, wherein a total thickness of the first to third dielectric layers ranges from approximately 100 Å to approximately 150 Å.

8. The capacitor of claim 1, wherein the lower electrode and the upper electrode comprise a metal.

9. The capacitor of claim 8, wherein the metal comprises one selected from the group consisting of TiN, Ru, Pt, Ir, and HfN, or a combination thereof.

* * * * *